United States Patent
Harada et al.

(10) Patent No.: US 8,266,502 B2
(45) Date of Patent: Sep. 11, 2012

(54) RECORDING/REPRODUCING APPARATUS AND RECORDING/REPRODUCING METHOD

(75) Inventors: Tsutomu Harada, Kanagawa (JP); Yoshihiko Deoka, Tokyo (JP); Hisato Hirasaka, Tokyo (JP); Toshihiko Hirose, Kanagawa (JP); Toshiyuki Hirose, Kanagawa (JP); Osamu Nakamura, Kanagawa (JP); Akira Itou, Tokyo (JP)

(73) Assignee: Sony Corporation, Tokyo (JP)

(*) Notice: Subject to any disclaimer, the term of this patent is extended or adjusted under 35 U.S.C. 154(b) by 972 days.

(21) Appl. No.: 12/270,004

(22) Filed: Nov. 13, 2008

(65) Prior Publication Data
US 2009/0158125 A1     Jun. 18, 2009

(30) Foreign Application Priority Data
Dec. 13, 2007 (JP) .................. 2007-322159

(51) Int. Cl.
*G11C 29/00* (2006.01)
(52) U.S. Cl. ..................... 714/770; 714/774
(58) Field of Classification Search .......... 714/770, 714/774
See application file for complete search history.

(56) References Cited

U.S. PATENT DOCUMENTS

| 7,209,306 B2 | 4/2007 | Nakamura | |
|---|---|---|---|
| 2004/0169948 A1 | 9/2004 | Nakamura | |
| 2005/0240856 A1* | 10/2005 | Hayashi | 714/800 |
| 2007/0220410 A1* | 9/2007 | Bae et al. | 714/800 |
| 2008/0040651 A1* | 2/2008 | Kanaoka et al. | 714/794 |
| 2008/0055990 A1* | 3/2008 | Ishikawa et al. | 365/185.09 |
| 2008/0109701 A1* | 5/2008 | Yu et al. | 714/760 |
| 2008/0148133 A1* | 6/2008 | Duggan | 714/796 |
| 2008/0162791 A1* | 7/2008 | Eldredge et al. | 711/103 |

FOREIGN PATENT DOCUMENTS

| JP | 7-169205 | 7/1995 |
|---|---|---|
| JP | 8-249832 | 9/1996 |
| JP | 2001-307434 | 11/2001 |
| JP | 2007-87530 | 4/2007 |

* cited by examiner

*Primary Examiner* — M. Mujtaba K Chaudry
(74) *Attorney, Agent, or Firm* — Oblon, Spivak, McClelland, Maier & Neustadt, L.L.P.

(57) ABSTRACT

A recording/reproducing apparatus includes an encoding section, a decoding section, and a first judging section. The encoding section is configured to encode data that is to be recorded onto a recording medium into an LDPC (Low Density Parity Check) code. The decoding section is configured to decode the LDPC code read out from the recording medium. The judging section is configured to judge a block with a recording error based on one of a block error flag and an iterative decoding count output from the decoding section.

2 Claims, 16 Drawing Sheets

10 Streaming tape drive

RECORDING/REPRODUCING APPARATUS AND RECORDING/REPRODUCING METHOD

CROSS REFERENCES TO RELATED APPLICATIONS

The present invention contains subject matter related to Japanese Patent Application JP 2007-322159 filed in the Japanese Patent Office on Dec. 13, 2007, the entire contents of which being incorporated herein by reference.

BACKGROUND OF THE INVENTION

1. Field of the Invention

The present invention relates to a recording/reproducing apparatus and a recording/reproducing method for recording data onto a magnetic recording medium and reproducing the recorded data therefrom.

2. Description of the Related Art

So-called streaming tape drives are known as drive apparatuses capable of recording/reproducing digital data onto/from magnetic tapes. Although it depends on a tape length of a tape cassette as a medium, such streaming tape drives can be provided with an enormous recording capacity of, for example, about several ten to several hundred gigabytes. Therefore, the streaming tape drives are widely used for backing up data recorded on media such as a hard disk of a computer main body, for example. Moreover, the streaming tape drives are suited for use in saving image data and the like having a large data size.

In such streaming tape drives, high-density recordings are enabled by carrying out a recording/reproducing scan by a helical scanning method using a magnetic head on a rotary drum, while running a tape in a state where the magnetic tape is wound around the rotary drum at a predetermined lap angle and rotating the rotary drum. Thus, as is well known already, data is recorded on the magnetic tape such that tracks each formed to have a predetermined tilt angle with respect to a longitudinal direction of the magnetic tape are formed continuously.

Moreover, in the streaming tape drives, an operation called read-after-write is carried out during recording, and whether data has been recorded onto the magnetic tape normally is monitored in block units. For example, immediately after data is written to the magnetic tape, the written data is read and compared with original data, and if the original data and the read data do not match, it is judged as a write failure, and rewrite that involves redoing the writing is then carried out. Accordingly, data can be recorded onto the recording medium while avoiding partial deficient parts (see, Japanese Patent No. 3829741).

SUMMARY OF THE INVENTION

However, detection of a recording error by comparing the data obtained by reading the recorded data and the original data is inefficient, and may thus become an obstacle in increasing a recording speed and reproducing speed and miniaturizing the streaming tape drive.

Further, in recent years, a use of a method of decoding an LDPC (Low Density Parity Check) code by a sum-product algorithm in a system that requires an operation to be carried out in real time like data reproduction in an apparatus that carries out recording and reproduction with respect to a tape-like magnetic recording medium is being discussed, and a method of detecting a recording error that is suited for the streaming tape drive that uses a decoder for the LDPC code as described above is being demanded.

In view of the above circumstances, there is a need for a recording/reproducing apparatus and a recording/reproducing method suited for the system that uses the decoder for the LDPC code and capable of detecting a block with a recording error for the read-after-write at a higher speed.

According to an embodiment of the present invention, there is provided a recording/reproducing apparatus including an encoding section, a decoding section, and a first judging section. The encoding section is configured to encode data that is to be recorded onto a recording medium into an LDPC (Low Density Parity Check) code (based on a block error flag and an iterative decoding count obtained at a time of current reproduction and a block error flag and an iterative decoding count obtained at a time of last reproduction already stored in a buffer memory 23). The decoding section is configured to decode the LDPC code read out from the recording medium. The judging section is configured to judge a block with a recording error based on one of a block error flag and an iterative decoding count output from the decoding section.

Further, the recording/reproducing apparatus according to the embodiment of the present invention may further include a controlling section configured to control read-after-write based on a result of the judgment made by the first judging section.

According to the embodiment of the present invention, it is possible to obtain a recording/reproducing apparatus suited for a system that uses a decoder for the LDPC code and capable of detecting a block with a recording error for read-after-write at a higher speed.

The recording/reproducing apparatus according to the embodiment of the present invention may further include a memory section and a second judging section. The memory section is configured to store data of a block reproduced from the recording medium. The second judging section is configured to judge, based on one of a block error flag and an iterative decoding count obtained at a time of decoding a rewritten block and one of a block error flag and an iterative decoding count obtained at a time of decoding the same block before being rewritten, whether to overwrite reproduction data of the block before being rewritten that is stored in the memory section with reproduction data of the rewritten block.

According to the embodiment of the present invention, by judging whether to overwrite, with the reproduction data of the rewritten block, the reproduction data of the same block already stored in the memory section based on one of the block error flag and the iterative decoding count obtained at the time of the LDPC decoding, it becomes possible to store optimal data in the memory section as the reproduction data with respect to the data that is causing rewrite.

According to another embodiment of the present invention, there is provided a recording/reproducing method including: encoding data into an LDPC (Low Density Parity Check) code; recording the encoded data onto a recording medium; decoding the LDPC code read out from the recording medium; and judging a block with a recording error based on one of a block error flag and an iterative decoding count obtained as a result of the decoding. Further, in the recording/reproducing method according to the embodiment of the present invention, read-after-write of data of the block may be carried out when the block with the recording error is judged.

According to the embodiment of the present invention, it is possible to obtain a recording/reproducing method suited for a system that uses the decoder for the LDPC code and with which a block with a recording error for read-after-write can be detected at a higher speed.

Moreover, the recording/reproducing method according to the embodiment of the present invention may further include judging, based on one of a block error flag and an iterative decoding count obtained at a time of decoding a rewritten block and one of a block error flag and an iterative decoding count obtained at a time of decoding the same block before being rewritten, whether to overwrite reproduction data of the block before being rewritten that is stored in a memory section with reproduction data of the rewritten block.

Accordingly, by judging whether to overwrite, with the reproduction data of the rewritten block, the reproduction data of the same block already stored in the memory section based on one of the block error flag and the iterative decoding count obtained at the time of the LDPC decoding, it becomes possible to store optimal data in the memory section as the reproduction data with respect to the data that is causing rewrite.

According to the embodiments of the present invention, a recording/reproducing apparatus and a recording/reproducing method that are suited for a system that uses the decoder for the LDPC code and capable of detecting a block with a recording error for read-after-write at a higher speed can be obtained.

These and other objects, features and advantages of the present invention will become more apparent in light of the following detailed description of best mode embodiments thereof, as illustrated in the accompanying drawings.

DESCRIPTION OF PREFERRED EMBODIMENTS

Hereinafter, embodiments of the present invention will specifically be described with reference to the drawings.

Figure 1:
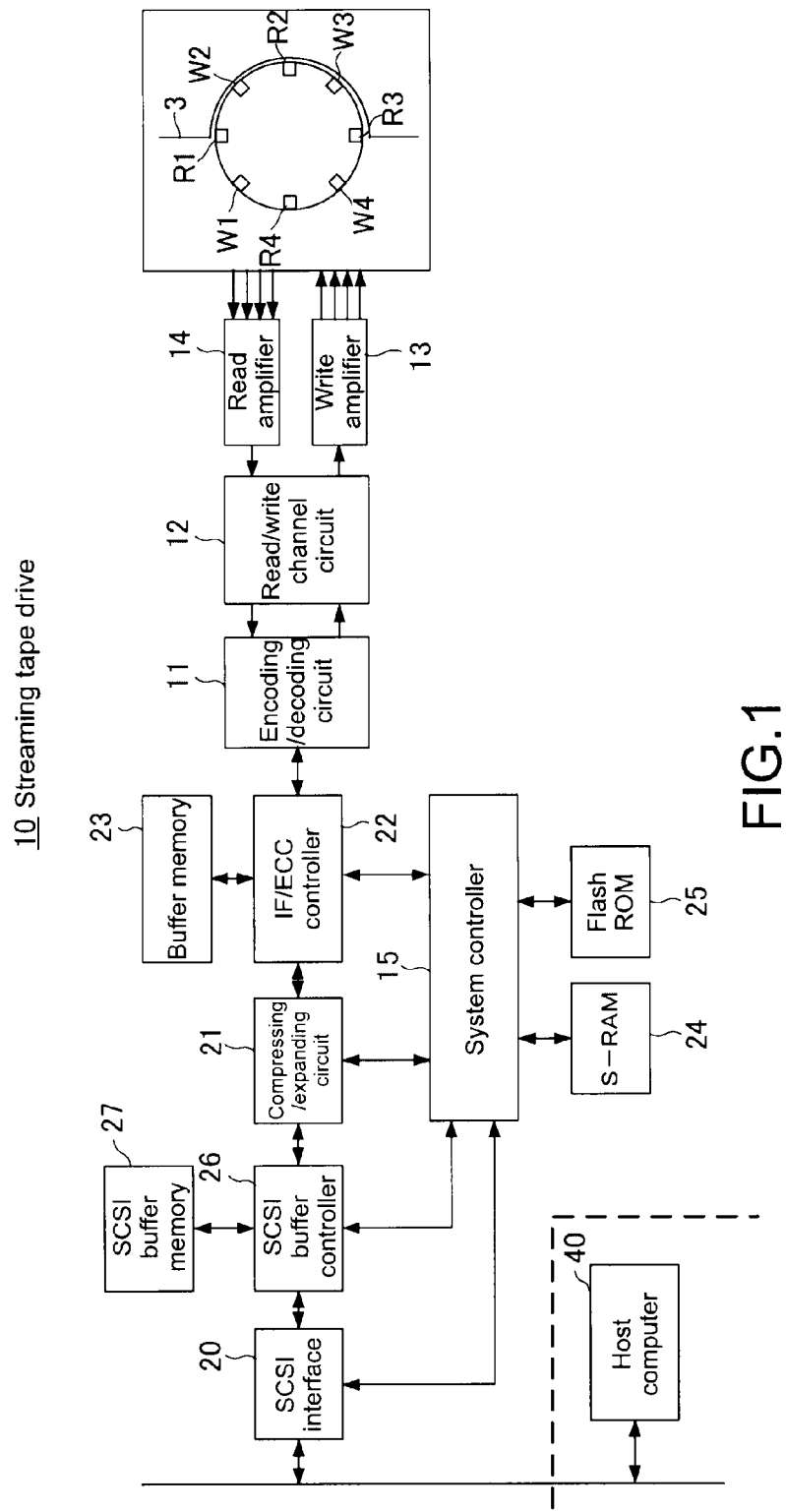
FIG. 1 is a diagram showing a structural example of a streaming tape drive corresponding to an embodiment of the present invention.

FIG. 1 is a diagram showing a structural example of a streaming tape drive corresponding to an embodiment of the present invention.

A streaming tape drive 10 carries out recording and reproduction with respect to a magnetic tape 3 of a tape cassette (not shown) by a helical scanning method. In the figure, a rotary drum 1 is provided with, for example, four recording heads W1 to W4 and four reproducing heads R1 to R4. The recording heads W1 to W4 have a structure in which two gaps with different azimuth angles are disposed extremely close to each other. The reproducing heads R1 to R4 also have predetermined azimuth angles.

The rotary drum 1 is rotated by a drum motor (not shown). The magnetic tape 3 drawn out from the tape cassette is wound around the rotary drum 1. Moreover, the magnetic tape 3 is conveyed in a forward direction or backward direction by a capstan motor (not shown) and a pinch roller (not shown).

In the streaming tape drive 10, an SCSI interface 20 is used for inputting and outputting data. When recording data, for example, pieces of data are successively input from a host computer 40 via the SCSI interface 20 in a transmission data unit of a fixed length of record, and are supplied to a compressing/expanding circuit 21 via an SCSI buffer controller 26. The SCSI buffer controller 26 controls a data transfer of the SCSI interface 20. An SCSI buffer memory 27 corresponds to a buffer means provided in correspondence with the SCSI buffer controller 26, for securing a transfer speed of the SCSI interface 20.

If necessary, the compressing/expanding circuit 21 carries out compressing processing on input data by a predetermined method. An output of the compressing/expanding circuit 21 is supplied to an IF/ECC controller 22 and is then temporarily stored in a buffer memory 23 by a controlling operation of the IF/ECC controller 22. The data stored in the buffer memory 23 is subjected to, under control of the IF/ECC controller 22, modulating processing so as to be fit for magnetic recording after an error correcting code is eventually added to data in a fixed length unit (i.e., group) which corresponds to 40 tracks of the magnetic tape.

The modulated data is supplied to an encoding/decoding circuit 11. The encoding/decoding circuit 11 is a circuit for carrying out LDPC encoding and decoding. In other words, the modulated data is encoded into bits of an LDPC code length N by the encoding/decoding circuit 11. The LDPC encoding involves, for example, obtaining a generator matrix G that satisfies GHt=0 from the check matrix H that defines the parity code, and multiplying data added with a header by the generator matrix G. Here, the check matrix H that defines the parity code is an M×N matrix constituted of elements "0" and "1" and is a sparse matrix. A sparse matrix is structured to have an extremely small number of elements "1" in the matrix. The bit count obtained by the encoding is the LDPC code length N, and a bit string corresponding to the LDPC code length N is set as one block.

The output of the encoding/decoding circuit 11 is supplied to a read/write channel circuit 12. The read/write channel circuit 12 adds a SYNC pattern to a head of a block obtained by the encoding/decoding circuit 11 and supplies it to a write amplifier 13. The write amplifier 13 carries out processing such as amplification and recording equalization on the data output from the read/write channel circuit 12 to generate a recording signal, and supplies the signal to the recording heads W1 to W4 of the respective channels. Accordingly, data is recorded onto the magnetic tape 3 from the recording heads W1 to W4.

Figure 6:
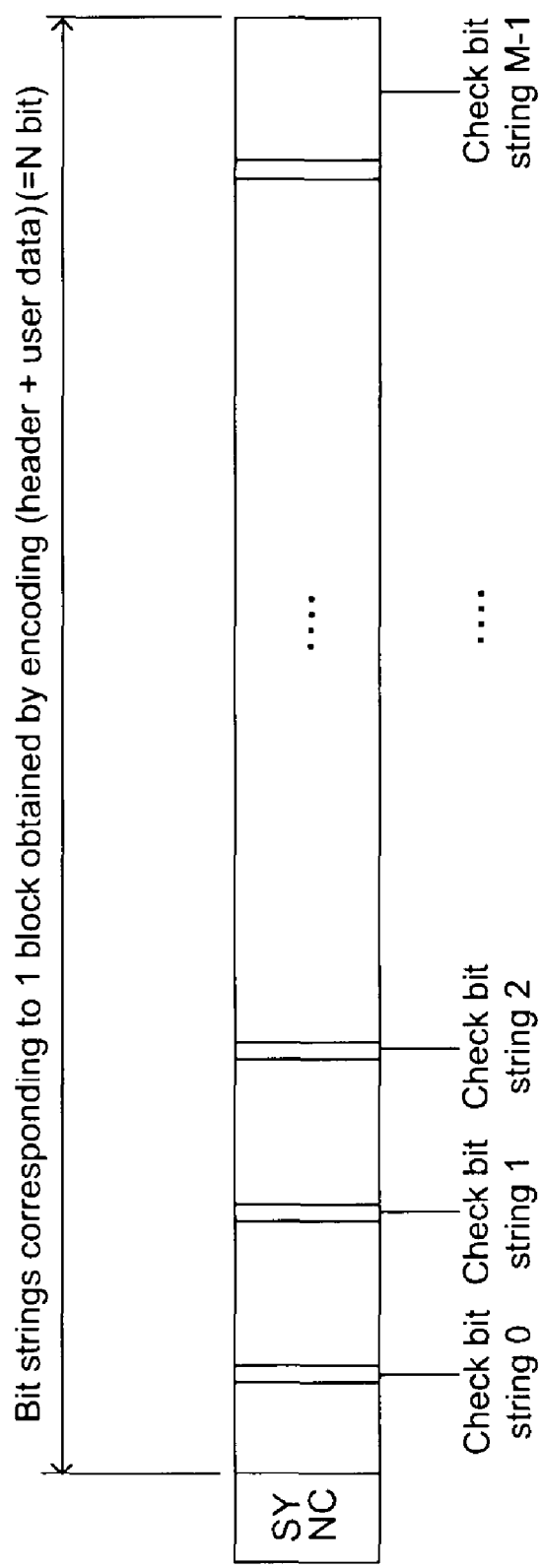
FIG. 6 is a diagram showing a structure of a recording bit string of one block.

FIG. 6 shows a structure of a recording bit string of one block. As shown in the figure, a SYNC pattern for detecting a block is added to the head of the recording bit string of one block, and a code word as a bit string of one block, that is obtained by encoding user data to which the header is added, is added after the SYNC pattern. The code word is constituted of a message bit string and a check bit string of the user data to which the header is added.

Next, an operation carried out when reproducing data will be described. The recording data of the magnetic tape 3 is read out by the reproducing heads R1 to R4 as an RF reproducing signal, and a reproduction output thereof is amplified by a read amplifier 14 and supplied to the read/write channel circuit 12. The read/write channel circuit 12 carries out A/D conversion, equalizing processing for phase synchronization, reproduction clock generation, information digitization, and the like on the output of the read amplifier 14 and supplies it to the encoding/decoding circuit 11. The encoding/decoding circuit 11 carries out LDPC decoding on the data output from the read/write channel circuit 12 and restores the recording data.

The output of the encoding/decoding circuit 11 is supplied to the IF/ECC controller 22. The IF/ECC controller 22 first carries out error correcting processing and the like. The result of the error correcting processing is temporarily stored in the buffer memory 23 and read out at a predetermined time point to be supplied to the compressing/expanding circuit 21. Based on a judgment of a system controller 15, if the data has been compressed by the compressing/expanding circuit 21 at the time of recording, the compressing/expanding circuit 21 carries out data expanding processing here, and if the data is uncompressed data, skips the data expanding processing and outputs the data as it is. The output data of the compressing/expanding circuit 21 is output to the host computer 40 as reproduction data via the SCSI buffer controller 26 and the SCSI interface 20.

An S-RAM 24 and a flash ROM 25 store data used by the system controller 15 in various types of processing. For example, the flash ROM 25 stores constants and the like used for control. The S-RAM 24 is a memory used as a work memory or used for storing various types of flag data, operational processing, and the like. Moreover, the flash ROM 25 also stores programs to be executed by the system controller 15 and various other types of data as firmware.

It should be noted that the S-RAM 24 and the flash ROM 25 may be structured as internal memories of a microcomputer constituting the system controller 15, or a structure in which a partial area of the buffer memory 23 is used as the work memory may be employed.

As shown in FIG. 1, information is mutually transmitted between the streaming tape drive 10 and the host computer 40 by thus using the SCSI interface 20. However, with respect to the system controller 15, the host computer 40 performs various communications using SCSI commands. It should be noted that like an IEEE1394 interface and the like, data interfaces other than the SCSI interface may be employed.

Figure 2:
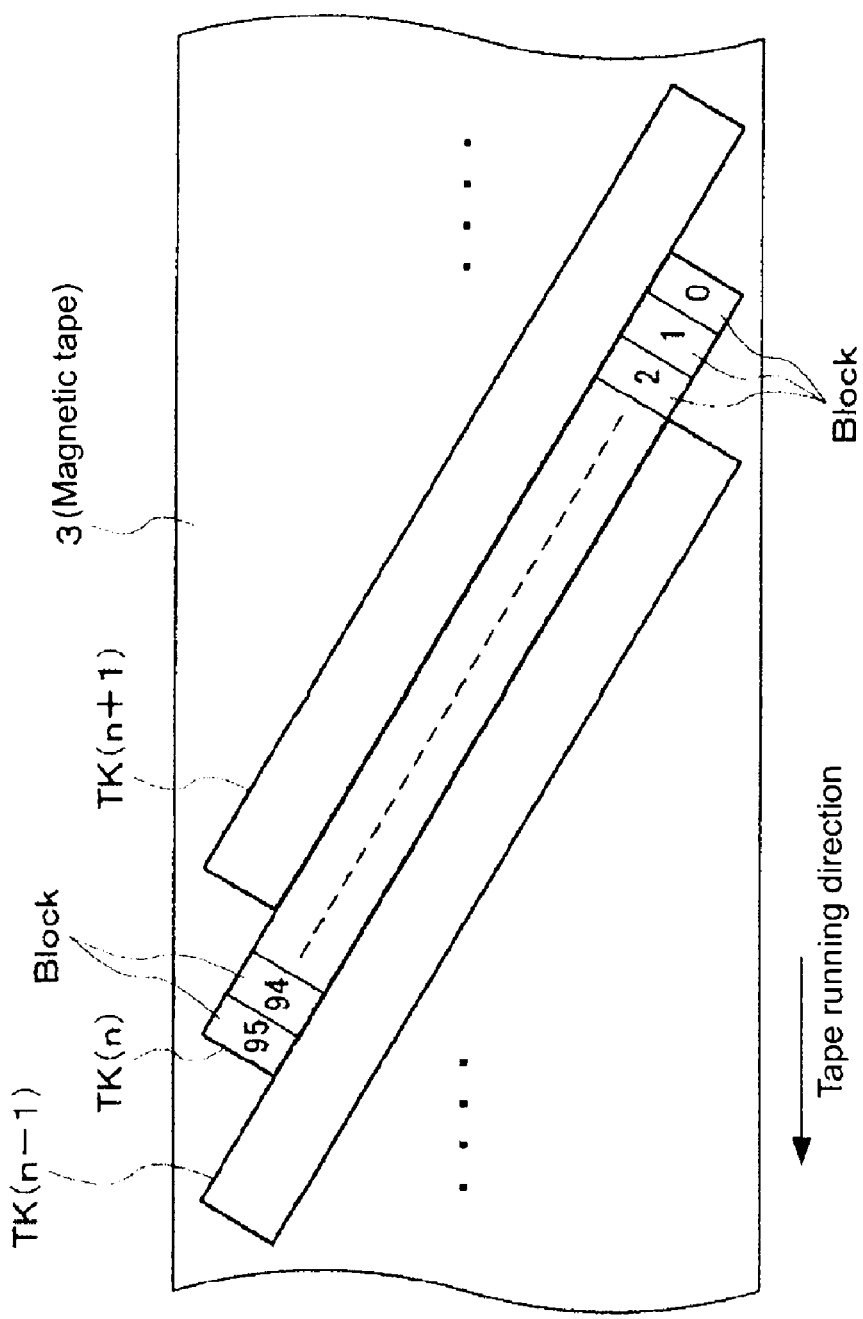
FIG. 2 is a diagram showing a data format of tracks recorded on a magnetic tape by the streaming tape drive.

FIG. 2 is a diagram showing a data format of tracks TK recorded on the magnetic tape 3 by the streaming tape drive 10. One track TK is constituted of a group of a plurality of blocks BK. The blocks BK have a fixed length based on a predetermined data size.

Figure 3:
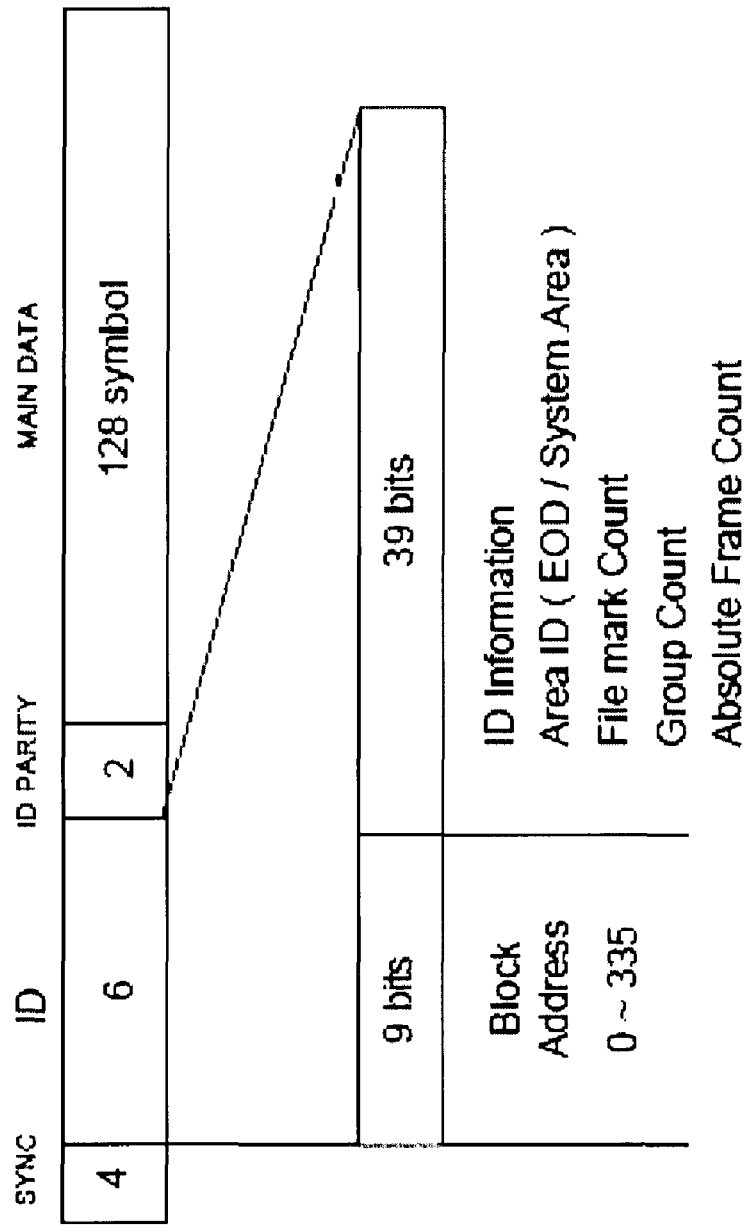
FIG. 3 is a diagram showing a block format.

FIG. 3 is a diagram showing a block format. A block is constituted of a SYNC area, an ID area, an ID parity area, and a main data area in the stated order from the head thereof. The ID area contains address information and the like as a storage location of the block stored in the buffer memory 23 so as to be rewritten.

Incidentally, in the system of the streaming tape drive 10, an operation called read-after-write (RAW) is executed. Here, as a reference, an operational example of the RAW in the related art will be described while referring to FIG. 4.

Figure 4:
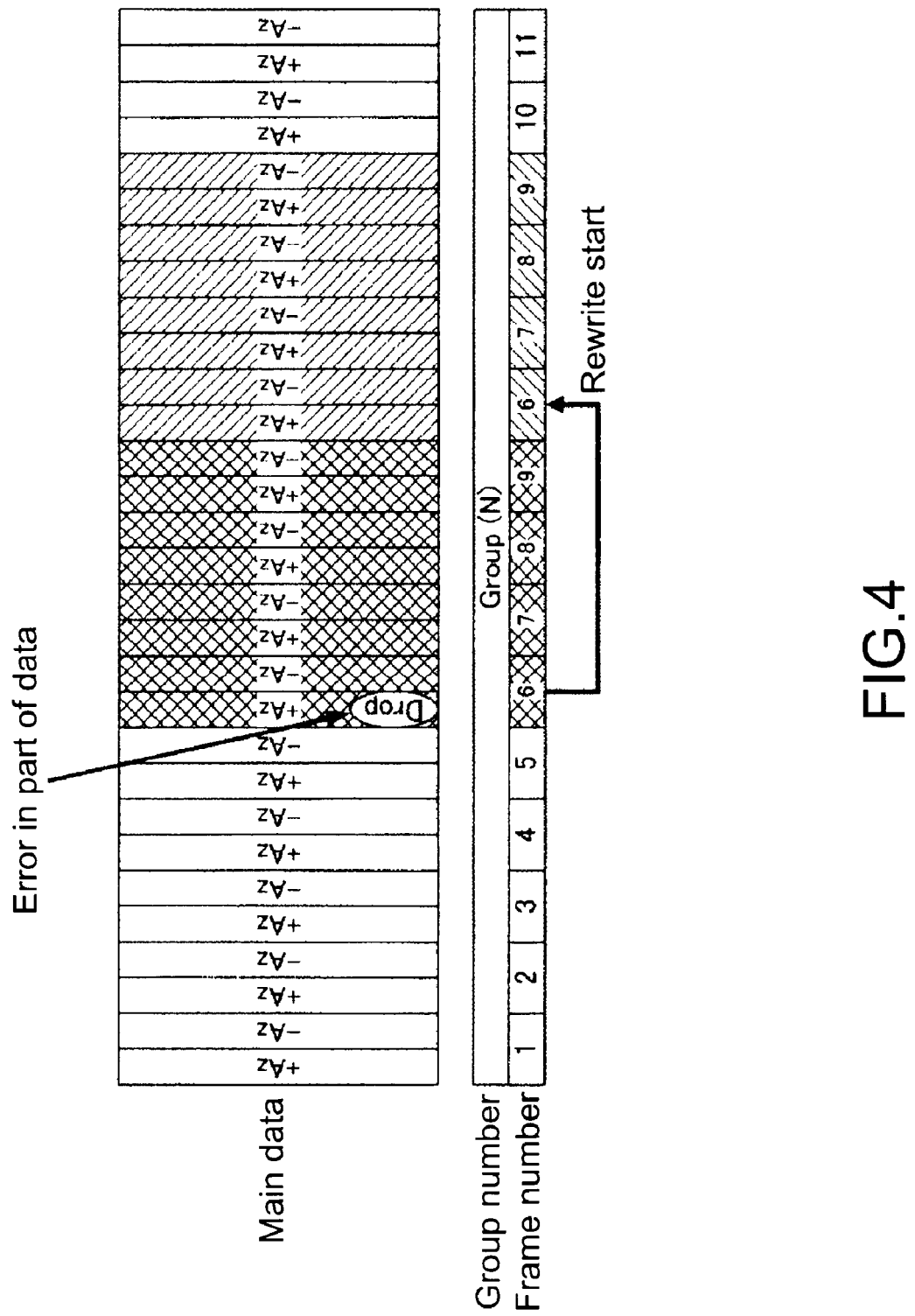
FIG. 4 is a diagram showing an operation of read-after-write.

FIG. 4 is a diagram schematically showing a case where the RAW is executed within the same group. A frame is formed by a plurality of successive tracks. In this case, one frame is constituted of two adjacent tracks of a +azimuth track (+Az) and a −azimuth track (−Az).

Here, assuming that, as shown in the figure, a recording error has occurred in a part of the +azimuth track (+Az) at a point when Frame 6 is recorded, though the RAW is executed in this case, it takes a certain period of time to read out data on the streaming tape drive side to detect a recording error and to thus start rewrite. Therefore, the rewrite is executed after recording has progressed to a certain extent even after the track in which the recording error has occurred. In the figure, the rewrite is started after the recording of Frame 9 is finished since the recording error has occurred in Frame 6. As the rewrite operation in this case, the data is recorded all over again from Frame 6 in track units after Frame 9. Here, by the read-after-write, the rewrite is continued until it is confirmed that the data has successfully been recorded. The block succeeded in recording is associated with the data at the corresponding address in the buffer memory 23 based on the address information contained in the ID area of the block, and judged that rewrite of the data is unnecessary.

In the read-after-write in this embodiment, the occurrence of a recording error is detected based on information obtained at the time of decoding the LDPC code.

Subsequently, an LDPC decoder will first be specifically described.

Figure 5:
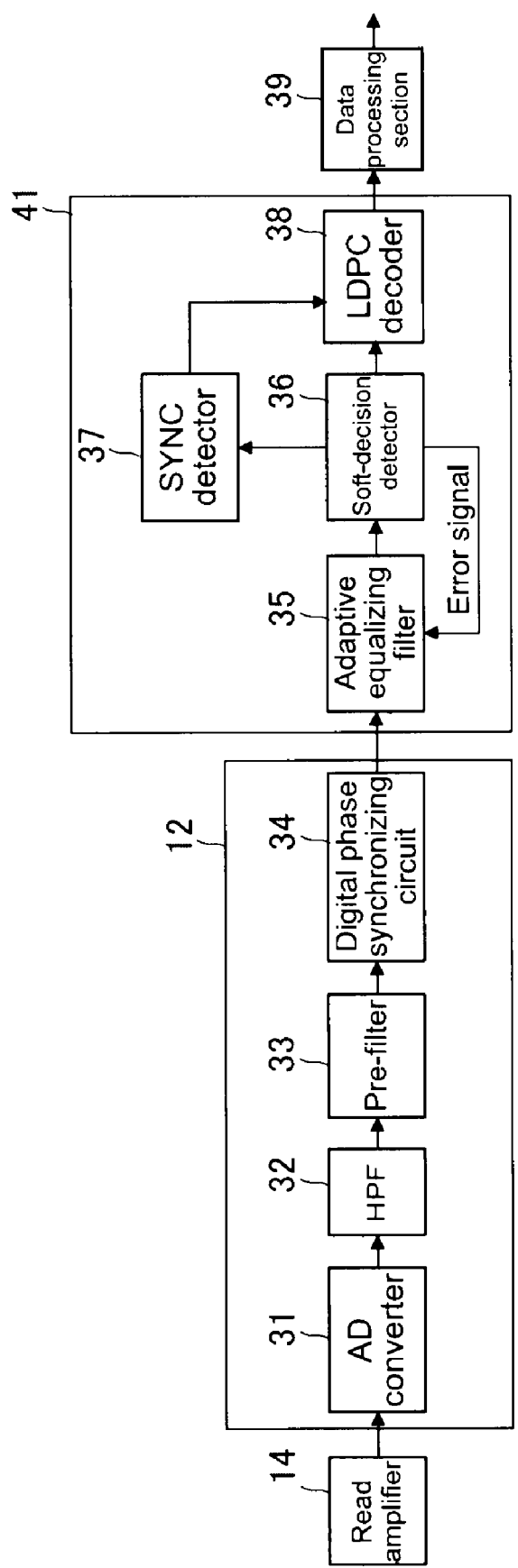
FIG. 5 is a diagram showing a structure of a reproducing system including an LDPC decoding section.

FIG. 5 is a diagram showing a structure of a reproducing system including an LDPC decoding section 41 of the encoding/decoding circuit 11. As shown in the figure, an analog reproducing signal as an output of the read amplifier 14 is converted into a digital value by an AD converter 31 of the read/write channel circuit 12 and is then output to an HPF (High Pass Filter) 32 of the read/write channel circuit 12 so that low-frequency components unnecessary for processing at a later stage are removed therefrom. A reproducing signal as an output of the HPF 32 is subjected to the equalizing processing for phase synchronization in a pre-filter 33 of the read/write channel circuit 12, and is then input to a digital phase synchronizing circuit 34 of the read/write channel circuit 12 to thus obtain a data series with synchronized phases.

An output of the digital phase synchronizing circuit 34 is input to an adaptive equalizing filter 35 of the LDPC decoding section 41. Based on an error signal output from a soft-decision detector 36 of a later stage, the adaptive equalizing filter 35 updates a filter tap coefficient thereof to an optimal value and equalizes the input signal to have predetermined target equalization characteristics.

A posterior probability detector or the like is used for the soft-decision detector 36, for example. The posterior probability detector calculates posterior probabilities $P0=P(x=0|Y=y)$ and $P1=P(x=1|Y=y)$ for each bit based on an input value y, and outputs a log-likelihood ratio (LLR) $\lambda=\log(P1/P0)$. Here, x represents a recording bit and takes a value of either "0" or "1", for example.

It should be noted that the posterior probability detector used may be one that calculates the LLR from a plurality of anteroposterior input values using a trellis diagram. The trellis diagram represents a code string generated during a process in which an encoder changes its state in accordance with an input bit series.

A SYNC detector 37 of the LDPC decoding section 41 detects a SYNC pattern at the head of the block from the LLR obtained in the soft-decision detector 36 and notifies an LDPC decoder 38 of the detected SYNC pattern.

The LDPC decoder 38 of the LDPC decoding section 41 is a circuit that inputs the LLR in block units in accordance with a detecting timing of the SYNC pattern obtained from the SYNC detector 37 to thus carry out iterative decoding of the LDPC code. The LDPC decoder 38 outputs to a data processing section 39 an iterative decoding count obtained at a time when the iterative decoding for each channel is ended.

The data processing section 39 is a circuit that carries out processing of restoring data for each channel from an estimated decoding word obtained in the LDPC decoder 38 and coupling the pieces of data to restore the recording data, and processes the iterative decoding count and a block error flag from the LDPC decoder 38.

Next, the iterative decoding of the LDPC code by the LDPC decoder 38 will be described in detail. In this embodiment, iterative decoding of the LDPC code is carried out using a sum-product algorithm. In the sum-product algorithm, calculation on the posterior probability is divided into two processing called "variable node processing" and "check node processing", and by iteratively carrying out the two processing, a bit series with high estimation accuracy is judged.

Figure 7:
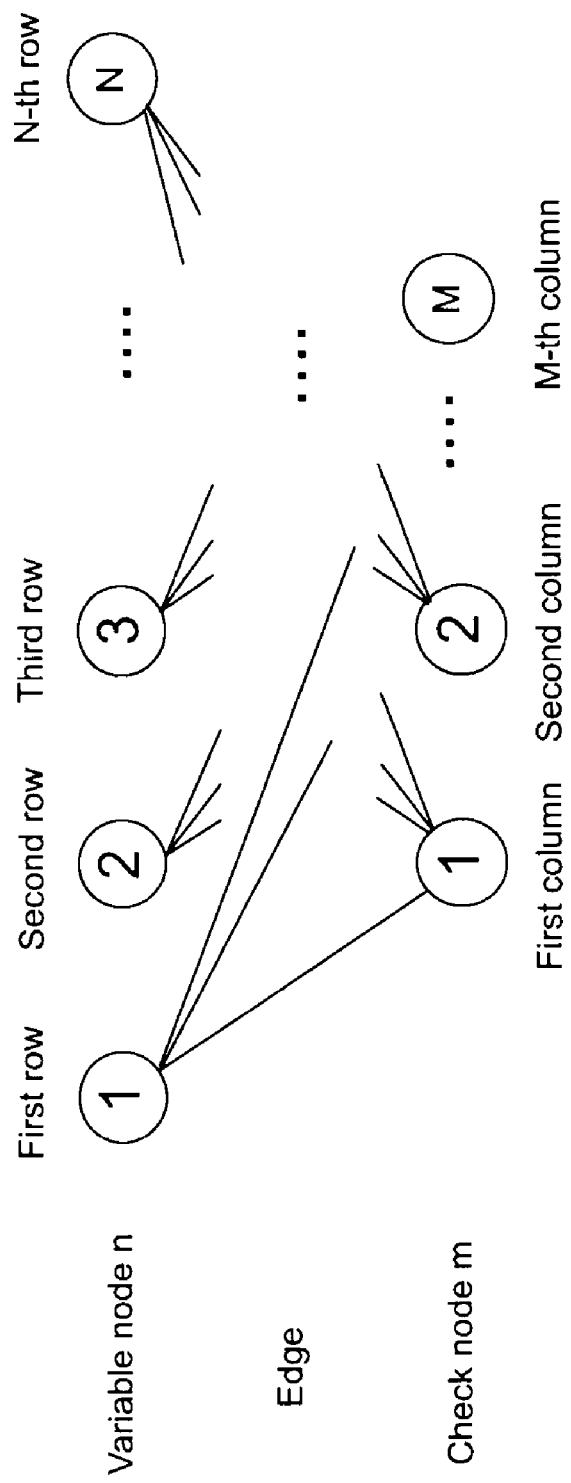
FIG. 7 is a diagram showing node representations of a parity check matrix H of an LDPC code.

FIG. 7 is a diagram showing node representations of a parity check matrix H of the LDPC code. The LDPC parity check matrix H (N rows×M columns) is represented by N variable nodes, M check nodes, and edges. The edges connect a variable node n and a check node m when an element hnm at n-th row and m-th column of the parity check matrix H is "1".

Figure 8:
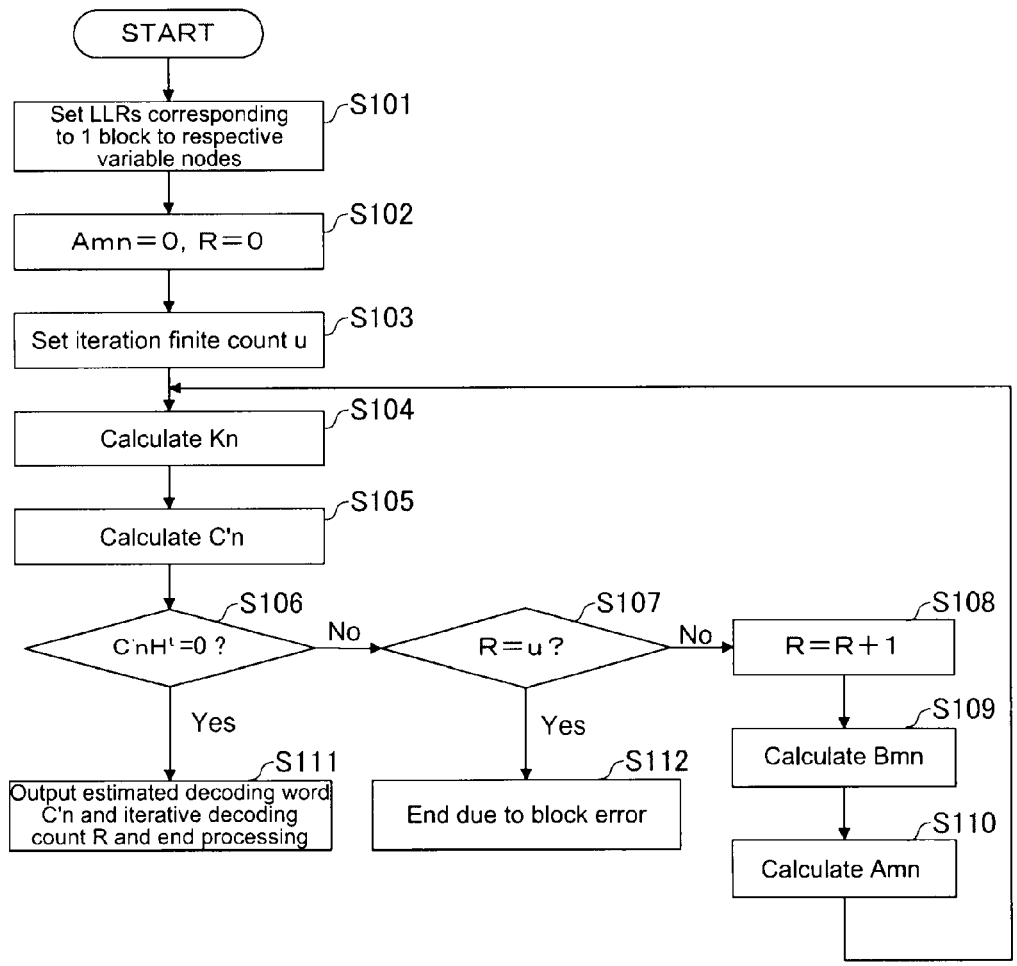
FIG. 8 is a flowchart showing iterative decoding of the LDPC code using an LDPC decoder.
Figure 9:
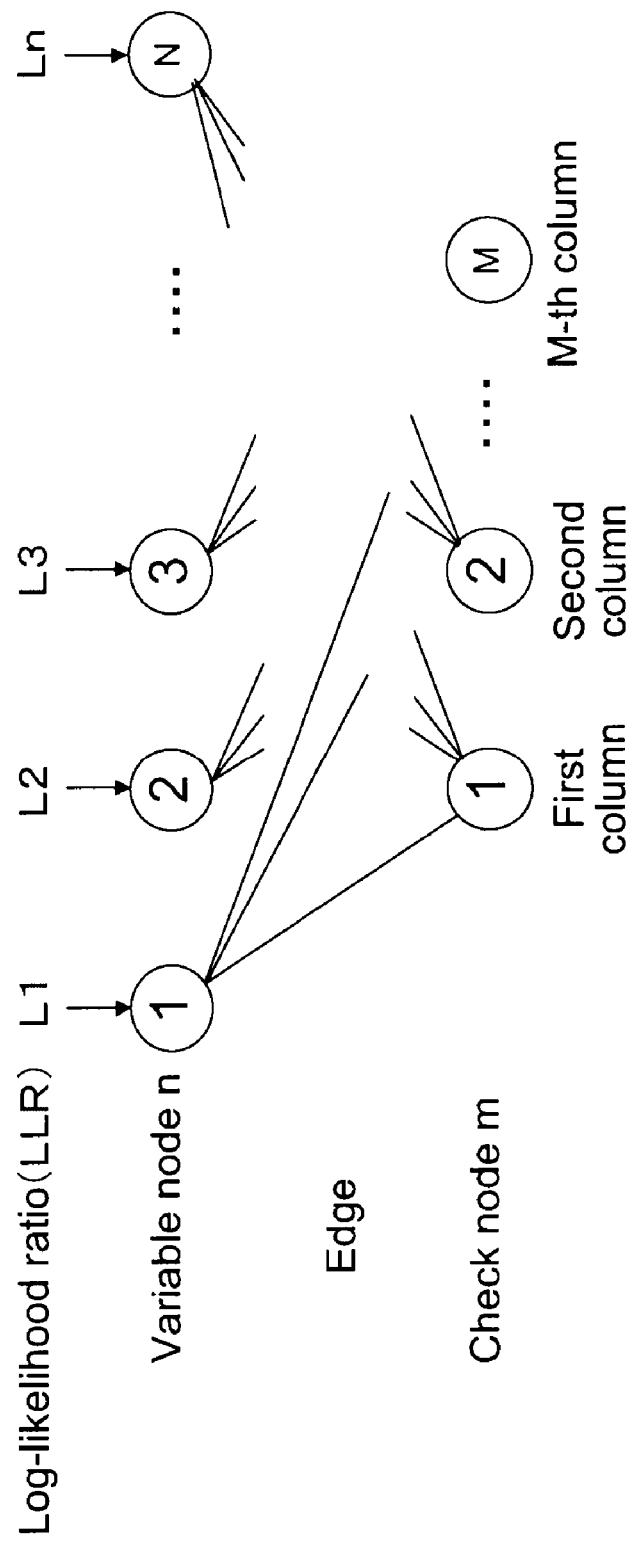
FIG. 9 is a diagram in which a log-likelihood ratio (LLR) for each bit of a single block is set to a variable node.

FIG. 8 is a flowchart showing the iterative decoding of the LDPC code by the LDPC decoder 38. The LDPC decoder 38 detects the head of the block based on a SYNC detecting signal from the SYNC detector 37, and sequentially sets log-likelihood ratios (LLRs) L1, L2, . . . Ln for each of bits corresponding to one block to N variable nodes, respectively, as shown in FIG. 9 (Step S101).

Next, the LDPC decoder 38 initializes a message Amn from the check node to the variable node and an iterative decoding count R (Step S102) and sets an iteration finite count u of the iterative decoding (Step S103).

Then, after going through Steps S104 to S107 and incrementing the iterative decoding count R (Step 108), first iterative processing is carried out as follows.

Figure 10:
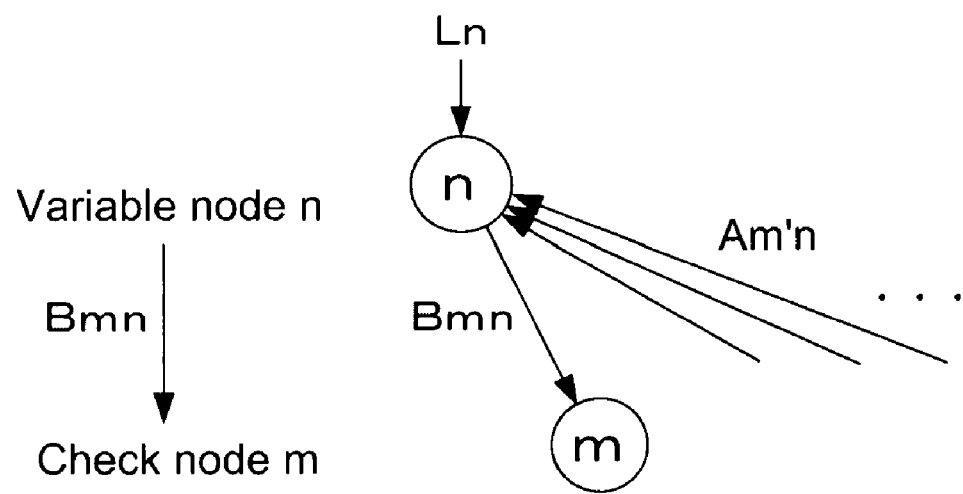
FIG. 10 is a diagram showing a calculating method of a message Bmn.

As the variable node processing, the LDPC decoder 38 calculates a message Bmn from the variable node n to the check node m using the following expression (in the following expression, "−" indicates subtraction) (Step S109). FIG. 10 is a diagram showing a calculating method of the message Bmn.

[Expression 1]
$$Bmn = \sum_{n' \in B(n)-m} Amn + Ln \quad (1)$$

Here, B(n)−m indicates subtraction of the check node m from Set B(n) of check nodes linked with the variable node n, and is represented by m' in FIG. 10. Am'n of FIG. 10 is a message to the variable node n calculated in the check node m'. Because an initial value of the message Am'n is 0, the first message Bmn from the variable node n to the check node m is Ln.

Figure 11:
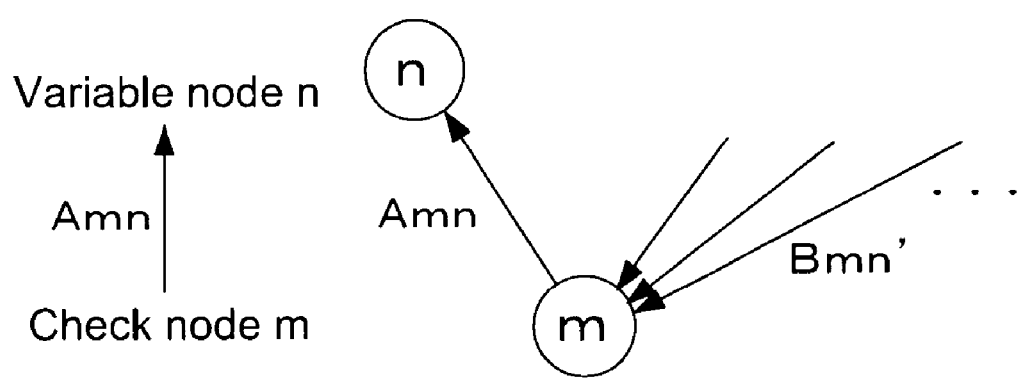
FIG. 11 is a diagram showing a calculating method of a message Amn.

Next, the LDPC decoder 38 calculates the message Amn from the check node m to the variable node n using the following expression (in the following expression, "−" indicates subtraction) (Step S110). FIG. 11 is a diagram showing a calculating method of the message Amn.

[Expression 2]
$$Amn = \prod_{n' \in A(m)-n} \mathrm{sign}(Bmn) f\left(\sum_{n' \in A(m)-n} f(|Bmn|)\right) \quad (2)$$

Here, a function f(x) is a Gallager function and f(x)=ln((exp(x)+1)/(exp(x)−1)). A(m)−n indicates subtraction of the variable node n from Set A(m) of variable nodes linked with the check node m, and is represented by n' in FIG. 11. Bmn' of FIG. 11 is a message to the check node m calculated in the variable node n'.

Next, the LDPC decoder 38 returns to Step S104 and calculates an approximate value Kn of the log posterior probability ratio using the following expression.

[Expression 3]
$$Kn = \sum_{m' \in B(n)} Amn + Ln \quad (3)$$

It should be noted that when mounting to LSI, approximate expressions are used for calculating the messages Amn and Bmn and the function f(x).

After ending the calculations of the messages Amn and Bmn and the approximate value Kn of the log posterior probability ratio, the LDPC decoder 38 obtains an estimated decoding word C'n based on the approximate value Kn of the log posterior probability ratio (Step S105). Here, C' is a substitution notation of C with circumflex. The estimated decoding word C'n is judged as follows. The LDPC decoder 38 judges the estimated decoding word C'n as "0" when the approximate value Kn of the log posterior probability ratio is 0 or more and judges the estimated decoding word C'n as "1" when the approximate value Kn of the log posterior probability ratio is less than 0.

Next, regarding the currently-obtained estimated decoding word C'n, the LDPC decoder 38 judges whether a parity check condition of C'nHt=0 is satisfied (Step S106). Here, Ht represents a transposed matrix of the LDPC parity check matrix H. When the estimated decoding word C'n satisfies the parity check condition, the LDPC decoder 38 outputs the currently-obtained estimated decoding word C'n to the data processing section 39, outputs the iterative decoding count R obtained at the time of ending the iterative decoding to the data processing section 39, and ends the decoding (Step S111).

Here, the processing from calculating the messages Bmn and Amn, the approximate value Kn of the log posterior probability ratio, and the estimated decoding word C'n up to judging whether the estimated decoding word C'n satisfies the parity check condition is referred to as "one iterative processing". The number of iterative processing performed is the iterative decoding count R.

When judged in Step S106 that the estimated decoding word C'n satisfies the parity check condition, the LDPC decoder 38 outputs the currently-obtained estimated decoding word C'n to the data processing section 39 as the decoding result and ends the iterative decoding, whereas when the estimated decoding word C'n does not satisfy the parity check condition, the LDPC decoder 38 judges whether the current iterative decoding count R has reached the iteration finite count u (Step S107). When the current iterative decoding count R has not reached the iteration finite count u, the LDPC decoder 38 increments the iterative decoding count R (Step S108) and then carries out the next iterative processing.

In the subsequent steps, the LDPC decoder 38 repeats the iterative processing until the generated estimated decoding word C'n is judged to satisfy the parity check condition or until immediately before the current iterative decoding count R reaches the iteration finite count u. When judged in Step S107 that the current iterative decoding count R has reached the iteration finite count u, that is, when the estimated decoding word C'n does not satisfy the parity check condition even after the iterative processing is repeated u times, the LDPC decoder 38 forcibly ends the decoding processing by judging the block currently being processed as an error block, and outputs a block error flag to the data processing section 39 (Step S112).

Figure 12:
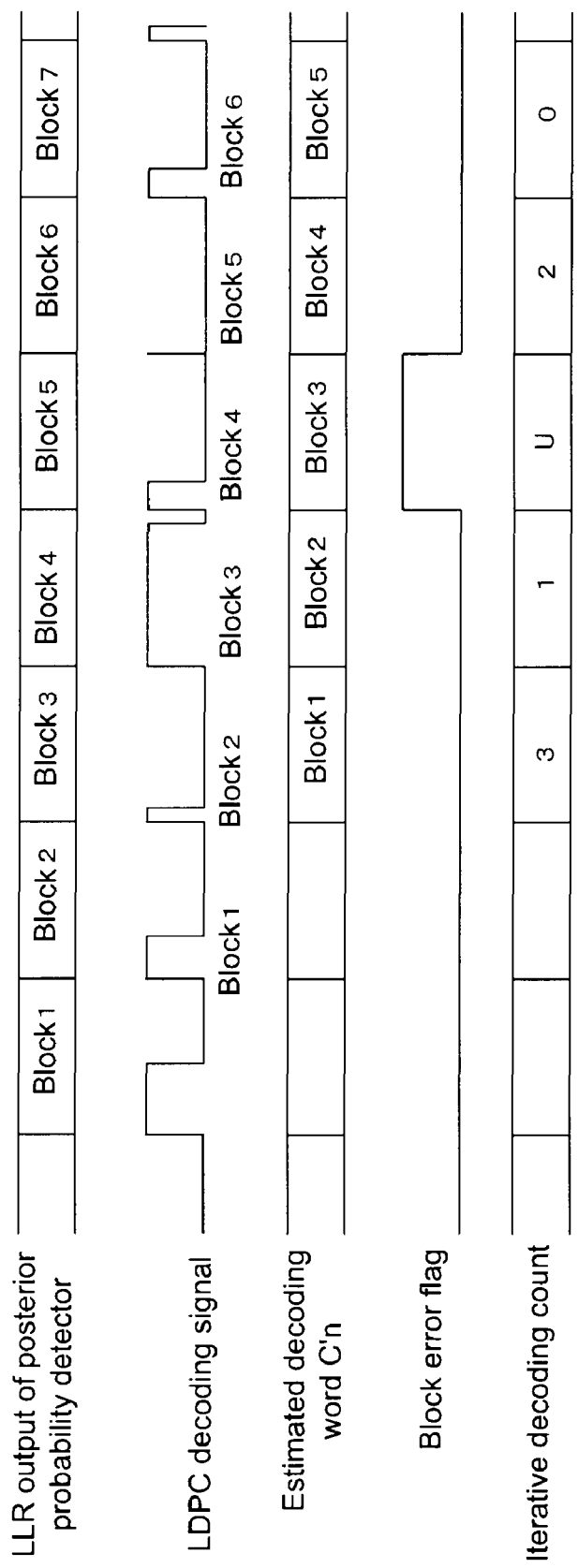
FIG. 12 is a timing chart of the LDPC decoder.

FIG. 12 is a timing chart of the LDPC decoder 38.

The iterative decoding of the LDPC code is started based on the LLR corresponding to one block output from the soft-decision detector 36 (posterior probability detector). An LDPC decoding signal is a signal that indicates an internal state of the LDPC decoder 38, and takes a value of "1" while the iterative decoding is carried out by the LDPC decoder 38 and takes a value of "0" when the iterative decoding is ended. Because the iterative decoding count differs depending on the block, the length of the section with the LDPC decoding signal of "1" differs depending on the block. However, the LDPC decoder 38 internally stores the estimated decoding word C'n and stands by such that the timings at which the estimated decoding word C'n is output are made the same even when the iterative decoding is ended early. The block error flag is a signal that indicates "1" with respect to a block in which the estimated decoding word C'n does not satisfy the parity check condition even after the iterative decoding is carried out (iteration finite count) u times. In this example, Block 3 corresponds to that block. The iterative decoding count is the number of iterative decoding required for decoding each block. In this example, the iterative decoding counts are 3 in Block 1, 1 in Block 2, u in Block 3, 2 in Block 4, and 0 in Block 5. Generally, the iterative decoding count increases when a quality of the reproducing signal is poor and an SN ratio is small.

Next, descriptions will be given on an operation carried out when performing control of read-after-write by detecting an occurrence of a recording error based on the block error flag and the iterative decoding count obtained at the time of decoding the LDPC code.

Figure 13:
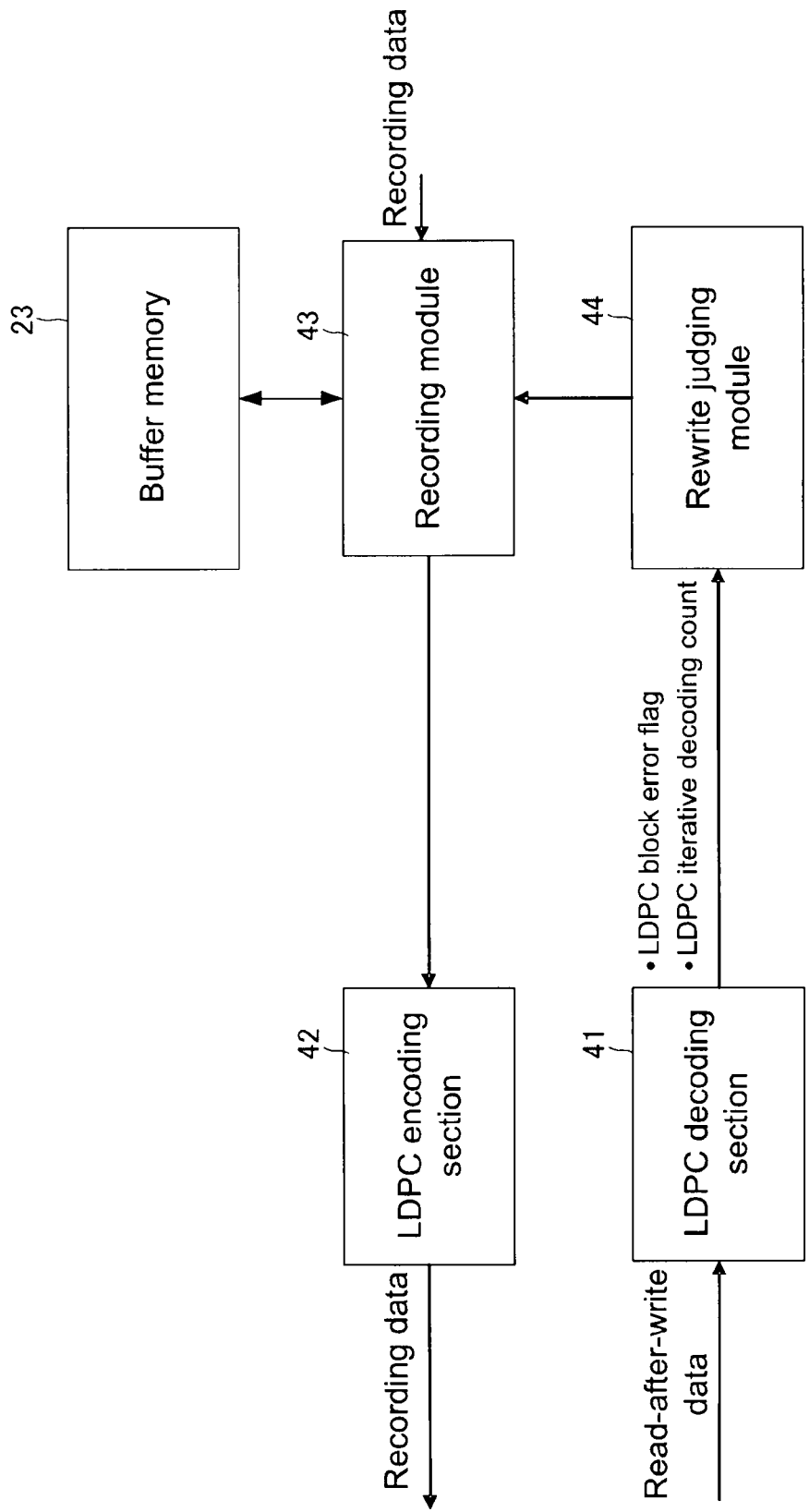
FIG. 13 is a block diagram showing a structure for carrying out control of read-after-write by detecting an occurrence of a recording error based on a block error flag or an iterative decoding count obtained at a time of decoding the LDPC code.

FIG. 13 is a block diagram showing a structure for carrying out the control of read-after-write by detecting an occurrence of the recording error based on the block error flag and the iterative decoding count obtained at the time of decoding the LDPC code. When an occurrence of the recording error is detected based on the block error flag and the iterative decoding count output from the LDPC decoding section 41 at the time of read-after-write, a rewrite judging module 44 of the data processing section 39 controls a recording module 43 to rewrite data in which the recording error has occurred. Here, the detection of the occurrence of the recording error based on the block error flag and the iterative decoding count is carried out as follows.

Figure 14:
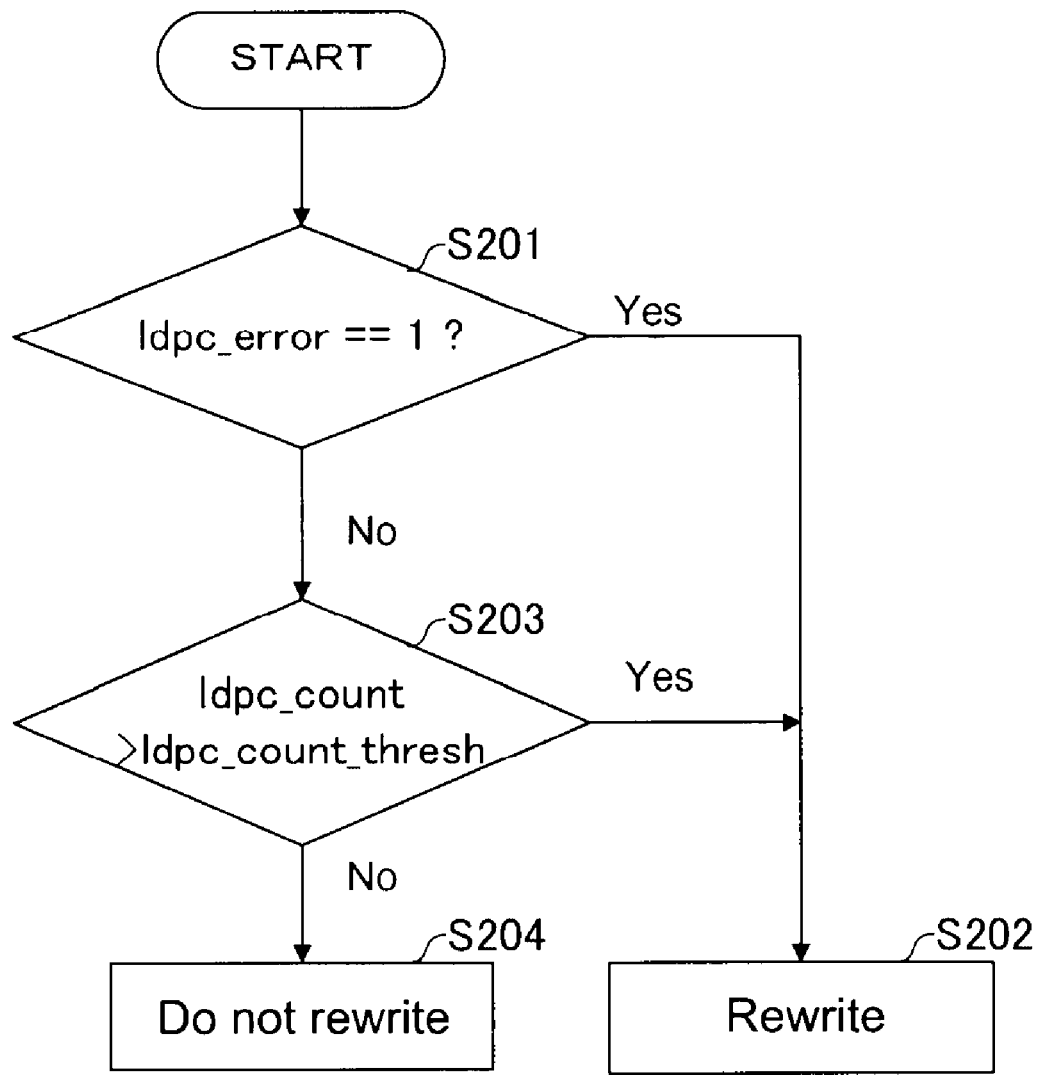
FIG. 14 is a flowchart showing the control of FIG. 13.

FIG. 14 is a flowchart showing the detection of the occurrence of the recording error based on the block error flag and the iterative decoding count. Here, ldpc_error is the block error flag at the time of read-after-write, ldpc_count is the LDPC iterative decoding count at the time of read-after-write, and ldpc_count_thresh is an LDPC iterative decoding count threshold value for rewrite.

As long as the recording module 43 is not notified by the rewrite judging module 44 that rewrite is unnecessary, the recording module 43 continues executing rewrite. First, the rewrite judging module 44 checks a value of ldpc_error (Step S201), and when the value is "1", judges that a recording error has occurred and does not notify the recording module 43 that rewrite is unnecessary (Step S202). When judged that the value of ldpc_error is not "1", the rewrite judging module 44 then judges whether a value of ldpc_count is exceeding that of ldpc_count_thresh (Step S203), and when exceeding the value of ldpc_count_thresh, judges that a recording error has occurred and does not notify the recording module 43 that rewrite is unnecessary (Step S202). When not exceeding the value of ldpc_count_thresh, the rewrite judging module 44 judges that the recording error has not occurred and notifies the recording module 43 that rewrite is unnecessary together with the address indicated in the ID area of the block (Step S204).

As described above, according to this embodiment, by judging whether rewrite is necessary at the time of read-after-write based on the block error flag and the iterative decoding count obtained at the time of the LDPC decoding, the recording state in which reproduction is possible can be ensured. Further, because unnecessary rewrite can be avoided, recording efficiency can be improved.

It should be noted that although the control of read-after-write is carried out by detecting an occurrence of the recording error based on both the block error flag and the iterative decoding count in this embodiment, the control of read-after-write may instead be carried out based on one of the block error flag and the iterative decoding count.

Second Embodiment

In the above embodiment, the necessity of rewrite at the time of read-after-write has been judged based on the block error flag and the iterative decoding count obtained at the time of the LDPC decoding. However, it is also possible to judge, when data of the block that is the same as the block whose reproduction data is already stored in the buffer memory 23 by the past rewrite is read out again at the time of data reproduction, whether to overwrite, with the reproduction data of the rewritten block, the reproduction data of the same block stored in the buffer memory 23 based on the block error flag and the iterative decoding count. Moreover, the function described above may be added to the first embodiment.

Figure 15:
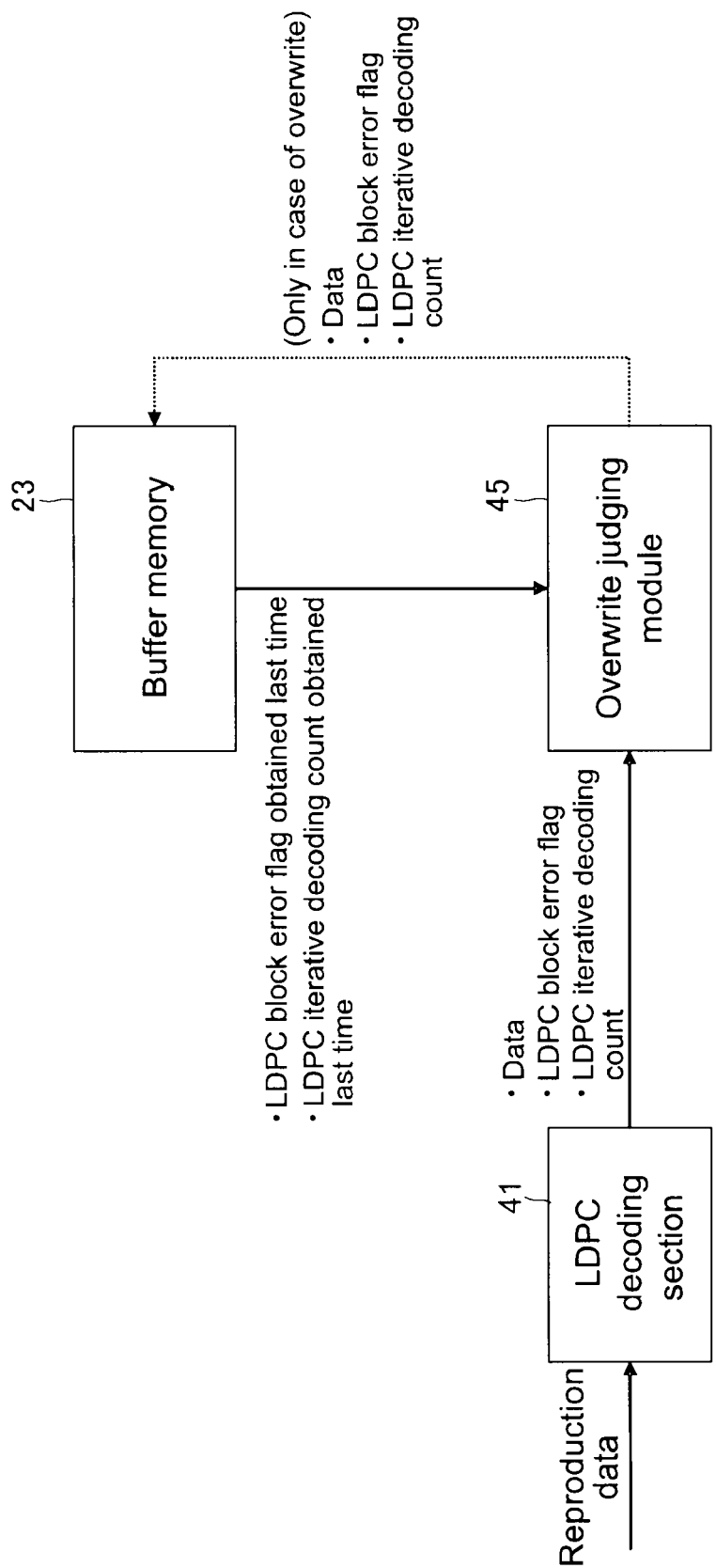
FIG. 15 is a block diagram showing a structure for controlling overwrite of a buffer memory based on the block error flag and the iterative decoding count obtained at the time of decoding the LDPC code.

FIG. 15 is a block diagram showing a structure for controlling overwrite of the buffer memory 23 based on the block error flag and the iterative decoding count obtained at the time of decoding the LDPC code. An overwrite judging module 45 of the data processing section 39 writes the block error flag and the iterative decoding count obtained at the time of the LDPC decoding of the reproduced block together with the reproduced data at the corresponding address in the buffer memory 23 based on the address information indicated in the ID area of that block. At this time, if the reproduction data of the same block is already stored in the buffer memory 23, the overwrite judging module 45 judges, based on the block error flag and the iterative decoding count obtained at the time of the current reproduction and the block error flag and the iterative decoding count obtained at the time of the last reproduction and already stored in the buffer memory 23, whether to overwrite, with the reproduction data of the block that has currently been rewritten, the reproduction data of the same block stored in the buffer memory 23. The judgment on whether to overwrite based on the block error flag and the iterative decoding count is carried out as follows.

Figure 16:
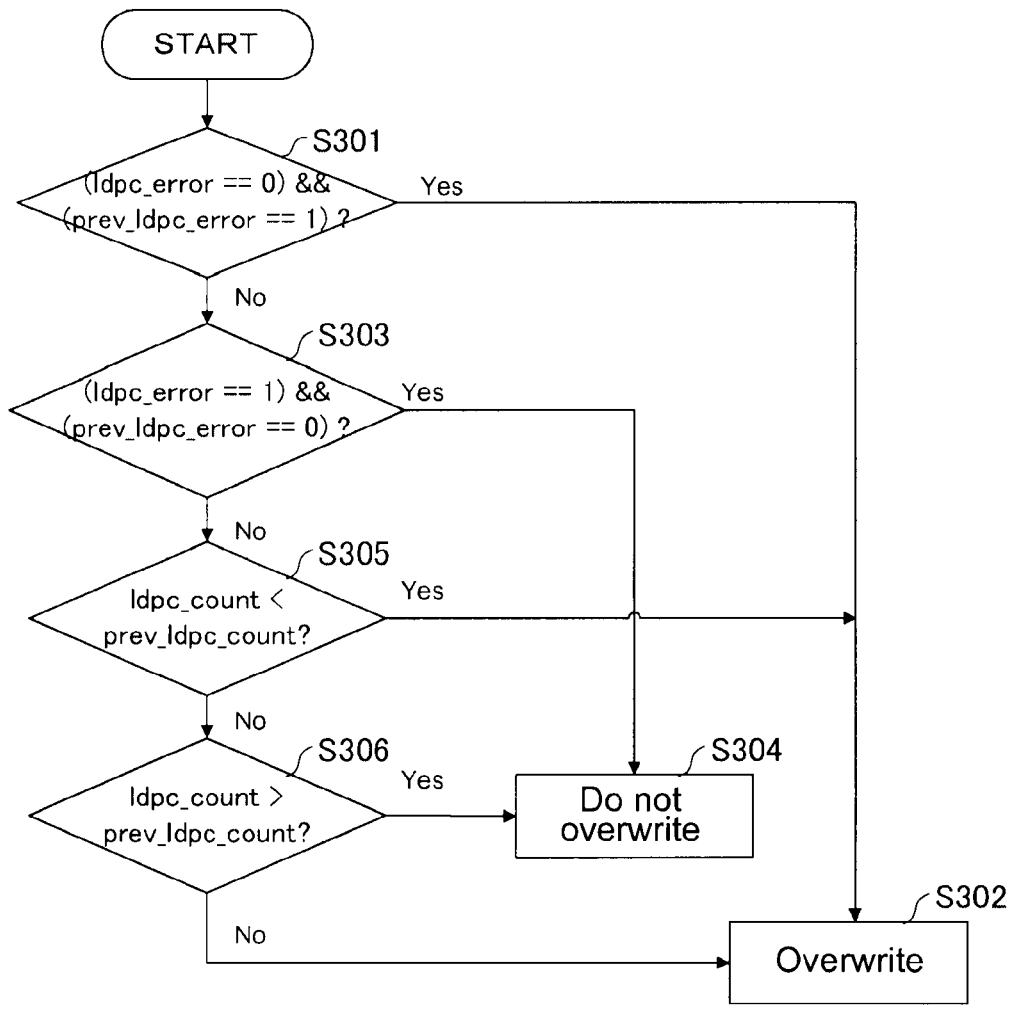
FIG. 16 is a flowchart showing the control of FIG. 15.

FIG. 16 is a flowchart of the judgment on whether to overwrite based on the block error flag and the iterative decoding count. Here, ldpc_error is an LDPC block error flag at the time of the current reproduction, ldpc_count is an LDPC iterative decoding count at the time of the current reproduction, prev_ldpc_error is an LDPC block error flag at the time of the last reproduction, and prev_ldpc_count is an LDPC iterative decoding count at the time of the last reproduction.

The overwrite judging module 45 judges whether a first condition, that is, a condition in which a value of ldpc_error is "0" and a value of prev_ldpc_error is "1" is satisfied (Step S301). When the first condition is satisfied, the overwrite judging module 45 carries out control so that the reproduction data of the block that has currently been rewritten is used to overwrite the reproduction data of the same block stored in the buffer memory 23 (Step S302). When the first condition is not satisfied, the overwrite judging module 45 then judges whether a second condition, that is, a condition in which the value of ldpc_error is "1" and the value of prev_ldpc_error is "0" is satisfied (Step S303). When the second condition is satisfied, the overwrite judging module 45 does not execute overwrite (Step S304).

When the second condition is not satisfied, the overwrite judging module 45 then judges whether a third condition, that is, a condition in which the value of ldpc_count is smaller than that of prev_ldpc_count is satisfied (Step S305). When the third condition is satisfied, the overwrite judging module 45 carries out control so that the reproduction data of the block that has currently been rewritten is used to overwrite the reproduction data of the same block stored in the buffer memory 23 (Step S302). When the third condition is not satisfied, the overwrite judging module 45 judges whether a fourth condition, that is, a condition in which the value of ldpc_count is exceeding that of prev_ldpc_count is satisfied (Step S306) When the fourth condition is satisfied, the overwrite judging module 45 does not execute overwrite (Step S304). When the fourth condition is not satisfied, the overwrite judging module 45 carries out control so that the reproduction data of the block that has currently been rewritten is used to overwrite the reproduction data of the same block stored in the buffer memory 23 (Step S302).

As described above, according to this embodiment, by judging whether to overwrite the reproduction data of the block already stored in the buffer memory 23 with the data of the same block that has been reproduced again afterwards due to the past rewrite based on the block error flag and the iterative decoding count obtained at the time of the LDPC decoding, it is possible to store as the reproduction data optimal data for the data of the block in which rewrite is caused in the buffer memory 23.

It should be noted that in this embodiment, whether to overwrite, with the reproduction data of the block that has currently been rewritten, the reproduction data of the same block stored in the buffer memory 23 is judged based on the block error flag and the iterative decoding count obtained at the time of the current reproduction and the block error flag and the iterative decoding count obtained at the time of the last reproduction and already stored in the buffer memory 23. However, the control may be carried out based on one of the block error flag and the iterative decoding count.

Because a single track on the magnetic tape is scanned a plurality of times at different timings in non-track reproduction, it is possible to carry out overwrite with optimal reproduction data irrespective of whether the data has been rewritten, based on the block error flag and the iterative decoding count for each scan.

The present invention is not limited to the above embodiments and can of course be variously modified without departing from the gist of the present invention.

What is claimed is:

1. A recording/reproducing apparatus, comprising:
an encoding section configured to encode data that is to be recorded onto a recording medium into an LDPC (Low Density Parity Check) code;
a decoding section configured to decode the LDPC code read out from the recording medium;
a first judging section configured to judge a block with a recording error based on one of a block error flag and an iterative decoding count output from the decoding section;
a memory section configured to store data of a block reproduced from the recording medium; and
a second judging section configured to judge, based on one of a block error flag and an iterative decoding count obtained at a time of decoding a rewritten block and one of a block error flag and an iterative decoding count obtained at a time of decoding the same block before being rewritten, whether to overwrite reproduction data of the block before being rewritten that is stored in the memory section with reproduction data of the rewritten block.

2. A recording/reproducing method comprising:
encoding data into an LDPC (Low Density Parity Check) code;
recording the encoded data onto a recording medium;
decoding the LDPC code read out from the recording medium;
judging a block with a recording error based on one of a block error flag and an iterative decoding count obtained as a result of the decoding; and
judging, based on one of a block error flag and an iterative decoding count obtained at a time of decoding a rewritten block and one of a block error flag and an iterative decoding count obtained at a time of decoding the same block before being rewritten, whether to overwrite reproduction data of the block before being rewritten that is stored in a memory section with reproduction data of the rewritten block.

* * * * *